US011543069B2

(12) United States Patent
Huang et al.

(10) Patent No.: US 11,543,069 B2
(45) Date of Patent: Jan. 3, 2023

(54) HINGE

(71) Applicant: SYNCMOLD ENTERPRISE CORP., New Taipei (TW)

(72) Inventors: Chun-Hao Huang, New Taipei (TW); Chien-Cheng Yeh, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 329 days.

(21) Appl. No.: 16/814,571

(22) Filed: Mar. 10, 2020

(65) Prior Publication Data

US 2020/0292123 A1 Sep. 17, 2020

Related U.S. Application Data

(60) Provisional application No. 62/817,109, filed on Mar. 12, 2019.

(51) Int. Cl.
*E05D 7/04* (2006.01)
*F16M 11/10* (2006.01)
*F16M 11/20* (2006.01)
*H05K 5/02* (2006.01)
(Continued)

(52) U.S. Cl.
CPC ......... *F16M 11/10* (2013.01); *F16M 11/2021* (2013.01); *F16M 11/22* (2013.01); *G06F 1/1601* (2013.01); *H05K 5/0226* (2013.01); *E05D 7/0415* (2013.01); *F16M 2200/047* (2013.01)

(58) Field of Classification Search
USPC .......... 16/286, 287, 289, 290; 248/922, 923, 248/920, 133, 139, 140, 142, 135, 371, 248/372.1, 393, 395
See application file for complete search history.

(56) References Cited

U.S. PATENT DOCUMENTS 4,080,530 A * 3/1978 Krogsrud ........... F16M 11/2014
362/427
6,416,024 B1 * 7/2002 Lindsay ................. F16M 11/10
248/371
(Continued)

FOREIGN PATENT DOCUMENTS

TW M500437 U 5/2015
TW M509483 U 9/2015

*Primary Examiner* — Alfred J Wujciak
(74) *Attorney, Agent, or Firm* — Muncy, Geissler, Olds & Lowe, P.C.

(57) ABSTRACT

A hinge includes a bearing plate, a linkage mechanism, a shell element, and an elastic element. The linkage mechanism is linked to the bearing plate. The shell element is disposed on the support, is connected to the linkage mechanism and includes a receiving space. The elastic element is disposed in the receiving space and abuts against between the linkage mechanism and the shell element to provide an elastic force. When an external force is applied, the display device and the bearing plate rotate relative to the support between a first position and a second position. The bearing plate is linked to the linkage mechanism to compress or loosen the elastic element, and then the elastic force is changed. When the external force is removed, the display device and the bearing plate can be stopped at once at any position between the first position and the second position.

14 Claims, 9 Drawing Sheets

(51) Int. Cl.
G06F 1/16 (2006.01)
F16M 11/22 (2006.01)

(56) References Cited

U.S. PATENT DOCUMENTS

| | | | | |
|---|---|---|---|---|
| 7,252,277 | B2* | 8/2007 | Sweere | F16M 11/24 |
| | | | | 248/371 |
| 8,328,151 | B2* | 12/2012 | Gwag | F16M 11/10 |
| | | | | 248/922 |
| 10,801,660 | B1* | 10/2020 | Liu | F16M 11/08 |
| 2003/0075653 | A1* | 4/2003 | Li | F16M 11/2092 |
| | | | | 248/231.71 |
| 2006/0091274 | A1* | 5/2006 | Asamarai | F16M 13/02 |
| | | | | 248/292.11 |
| 2012/0138754 | A1* | 6/2012 | Lim | F16M 13/022 |
| | | | | 248/65 |
| 2018/0356031 | A1* | 12/2018 | Zebarjad | F16M 11/105 |
| 2020/0116301 | A1* | 4/2020 | Luo | F16M 11/048 |
| 2020/0191323 | A1* | 6/2020 | Huang | F16F 3/023 |
| 2021/0048139 | A1* | 2/2021 | Huang | F16M 11/16 |

* cited by examiner

HINGE

CROSS REFERENCE TO RELATED APPLICATION

This application claims the benefit of U.S. Provisional Application Ser. No. 62/817,109 filed on Mar. 12, 2019. The entirety of each Application is incorporated herein by reference.

BACKGROUND OF THE INVENTION

1. Field of the Invention

The present invention relates to a hinge. More particularly, the present invention relates to a hinge that comprises a linkage mechanism.

2. Description of Related Art

On the market, a hinge is adapted to connect between the display device and the upright post of the support. The conventional hinge comprises a torsional spring. The resistance provided by the torsional spring of the hinge and the friction generated by the elements of the hinge resist the gravity torque generated by the display device so that the display device is able to retain at a tilt angle relative to the working plane.

As disclosed in Taiwan Patent No. M509483, a supporting device comprises a cam assembly and a torsional spring, which generates a corresponding resistance torque when the rotating angle of the display device is increased or decreased. Taiwan Patent No. M500437 also discloses a supporting apparatus, which comprises a tilt device. The user may select the number of torsional springs to be activated according to the weight of the loaded device. The magnitude of the resistance torque can be adjusted according to the weight.

Therefore, the present invention provides another kind of the hinge. By arranging the linkage mechanism and the compression spring of the hinge, the compensation torque provided by the compression spring may vary according to the position of the display device which rotates between a first position and a second position. The force curve of the compression spring is relatively gentle, and a better tactile feel in operation is provided.

SUMMARY OF THE INVENTION

One of the main objects of the present invention is to provide a hinge. By arranging the linkage mechanism and the elastic element in the hinge, the compensation torque provided by the elastic element matches the gravity torque provided by the display device located at any position. Backed by the friction generated among the elements of the hinge, the display device can be stopped at once at any position with any tilt angle.

Another object of the present invention is to provide a hinge. The compression spring adapted in the present invention provides a large supporting force and a wide supporting range. With the cooperation between the elastic element and the adjustment module, the elastic force range provided by the elastic element can be adjusted. Different compensation torque phases can be set correspondingly to the weights of each different display device. Therefore, the compensation torque can effectively resist the gravity torque generated by each different display device, connected to the hinge.

To achieve the above objective, the present invention provides a hinge disposed on a support and adapted for supporting a display device. The hinge comprises a bearing plate, a linkage mechanism, a shell element, and an elastic element. The bearing plate is adapted for the display device to be disposed on and pivots between a first position and a second position relative to the support. The linkage mechanism is linked to the bearing plate. The shell element is disposed on the support and extends along a main axis. The shell element includes a first end, connected to the linkage mechanism, a second end, being relative to the first end, and a receiving space. The elastic element is disposed in the receiving space and abuts against between the linkage mechanism and the shell element to provide an elastic force. When an external force is applied, the display device and the bearing plate rotate relative to the support between the first position and the second position. The bearing plate is linked to the linkage mechanism to compress or loosen the elastic element to change the elastic force. When the external force is removed, the display device and the bearing plate can be stopped at once at any position between the first position and the second position.

The linkage mechanism includes a first link, a second link, and a sliding piece. The first link is pivoted on a first shaft and is connected to the bearing plate. The first link and the second link are pivoted on a second shaft, and the second link and the sliding piece are pivoted on a third shaft. The first link, the second link, and the sliding piece are linked to each other. The sliding piece linearly slides along the main axis and abuts against the elastic element.

When the bearing plate rotates from the first position to the second position, the first link rotates along with the bearing plate and links the second link and the sliding piece, so that the sliding piece slides towards the second end along the main axis to compress the elastic element and the elastic force is increased. When the bearing plate rotates from the second position to the first position, the sliding piece slides away from the second end along the main axis to loosen the elastic element and the elastic force is decreased.

The first shaft is fixed on the shell element. When the first link rotates along with the bearing plate, the second shaft and the third shaft move relative to the shell element.

When the bearing plate is located at the first position, a distance between the first shaft and the third shaft is the shortest and the elastic element is least compressed. When the bearing plate is located at the second position, the distance between the first shaft and the third shaft is the longest and the elastic element is most compressed.

In one embodiment, each of the second shaft and the third shaft is a step screw, having a head portion, a large diameter section, and a small diameter section. The head portion, the large diameter section, and the small diameter section are integrated. The second link is mounted around the large diameter sections. The second link has two pivot holes for the large diameter sections to pass through.

The sliding piece has a central rod and a thrust plate. The thrust plate is mounted around the central rod. The elastic element pushes the thrust plate.

In one embodiment, the elastic element is a compression spring.

In one embodiment, the shell element further includes a shell body and a blocking plate. The receiving space is formed in the shell body. The blocking plate is disposed in the receiving space. The elastic element pushes the blocking plate.

In a preferred embodiment, the hinge further comprises an adjustment module. The blocking plate is movably disposed along the main axis in the receiving space. When the adjustment module is adjusted, a position of the blocking plate along the main axis in the receiving space is changed to adjust a preliminary pre-compressed amount of the elastic element.

The adjustment module includes a screw. The screw pivots through the shell element and has a thread. The blocking plate has a tapped hole, and the screw is screwed in the blocking plate. When the screw rotates around the main axis, the blocking plate moves toward or away from the bearing plate along the main axis in the receiving space.

The screw has a rod body. The thread is formed on the rod body to be screwed in the blocking plate.

The sliding piece of the linkage mechanism has a blind hole. The screw has an end portion. The end portion is located in the receiving space. The sliding piece is slidably sleeved around the end portion of the screw through the blind hole.

The adjustment module further includes a knob. The screw further has a front portion relative to the end portion. The front portion is partially exposed outside of the shell element. The knob is fixed around the front portion and synchronously rotates with the screw.

The shell element further includes a slot extending along the main axis. The slot is formed on an inner surface of the shell body. The blocking plate further includes a protruding portion, and the protruding portion is slidably received in the slot.

DETAILED DESCRIPTION OF THE PREFERRED EMBODIMENT

Figure 1:
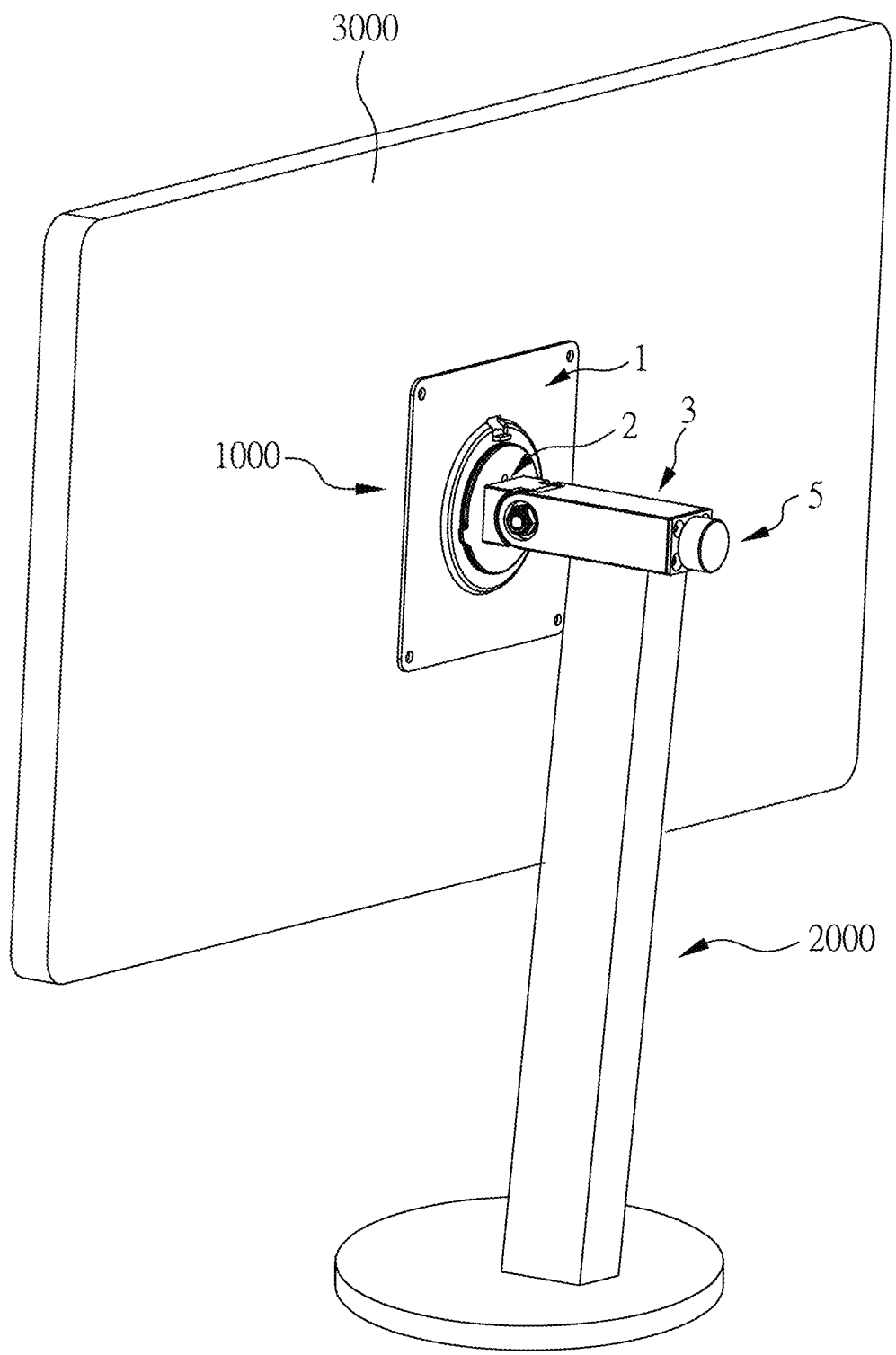
FIG. 1 is a perspective view showing the hinge of an embodiment of the present invention connected to a support and a display device.
Figure 2:
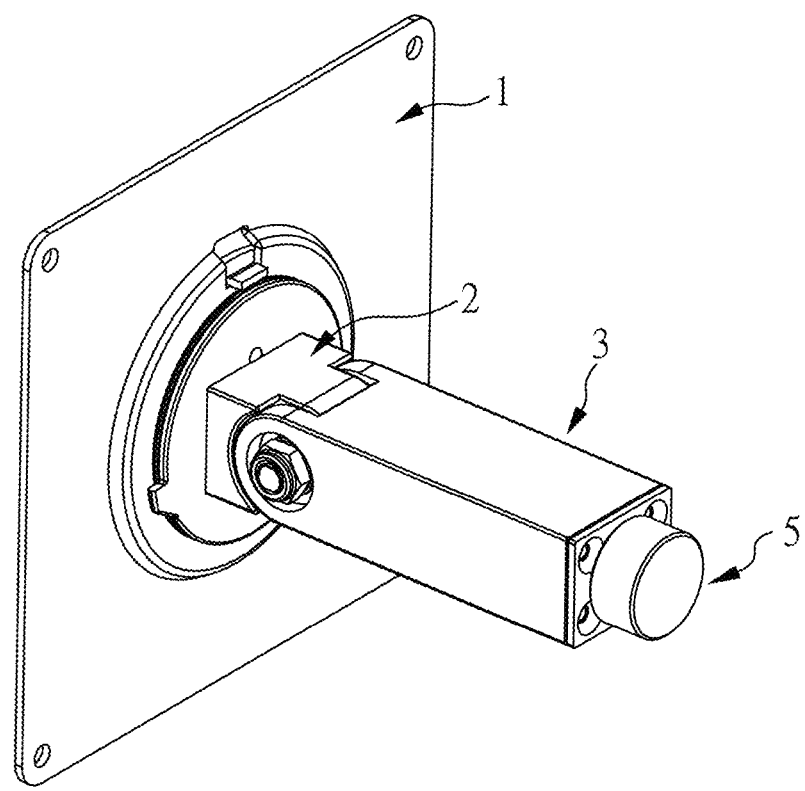
FIG. 2 is a perspective view showing the hinge of an embodiment of the present invention.
Figure 3:
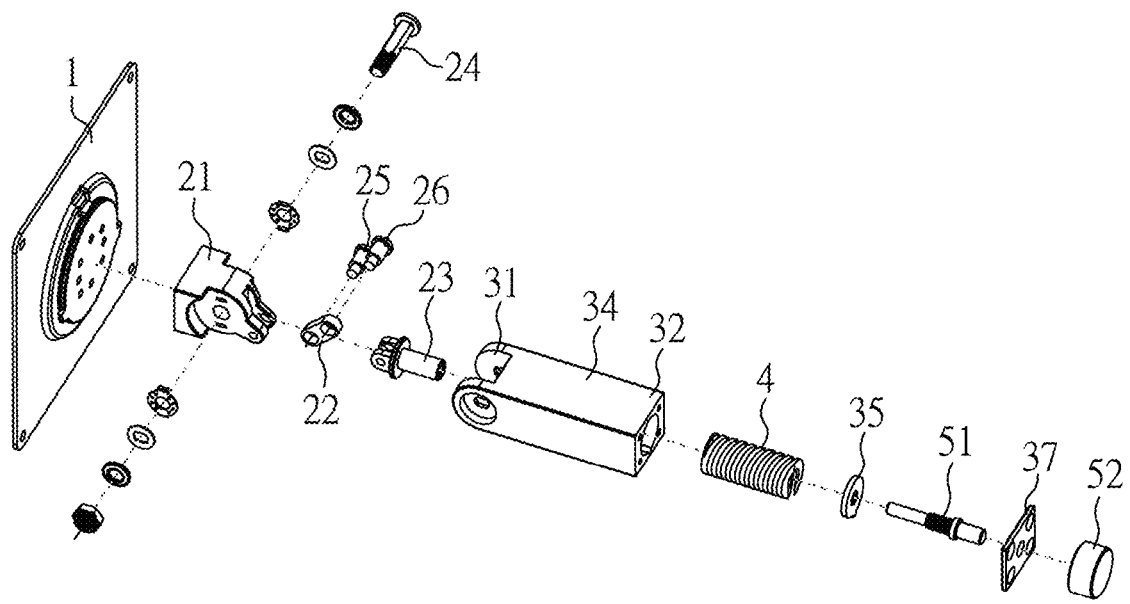
FIG. 3 is an exploded perspective view showing the hinge of an embodiment of the present invention.

FIG. 1 to FIG. 3 show perspective views and an exploded perspective view of the hinge 1000 of an embodiment of the present invention. The hinge 1000 is connected between a support 2000 and a display device 3000. The hinge 1000 is disposed on the support 2000 and supports the display device 3000 so that the display device 3000 is able to rotate relative to the support 2000. The hinge 1000 comprises a bearing plate 1, a linkage mechanism 2, a shell element 3, an elastic element 4, and an adjustment module 5.

Figure 4:
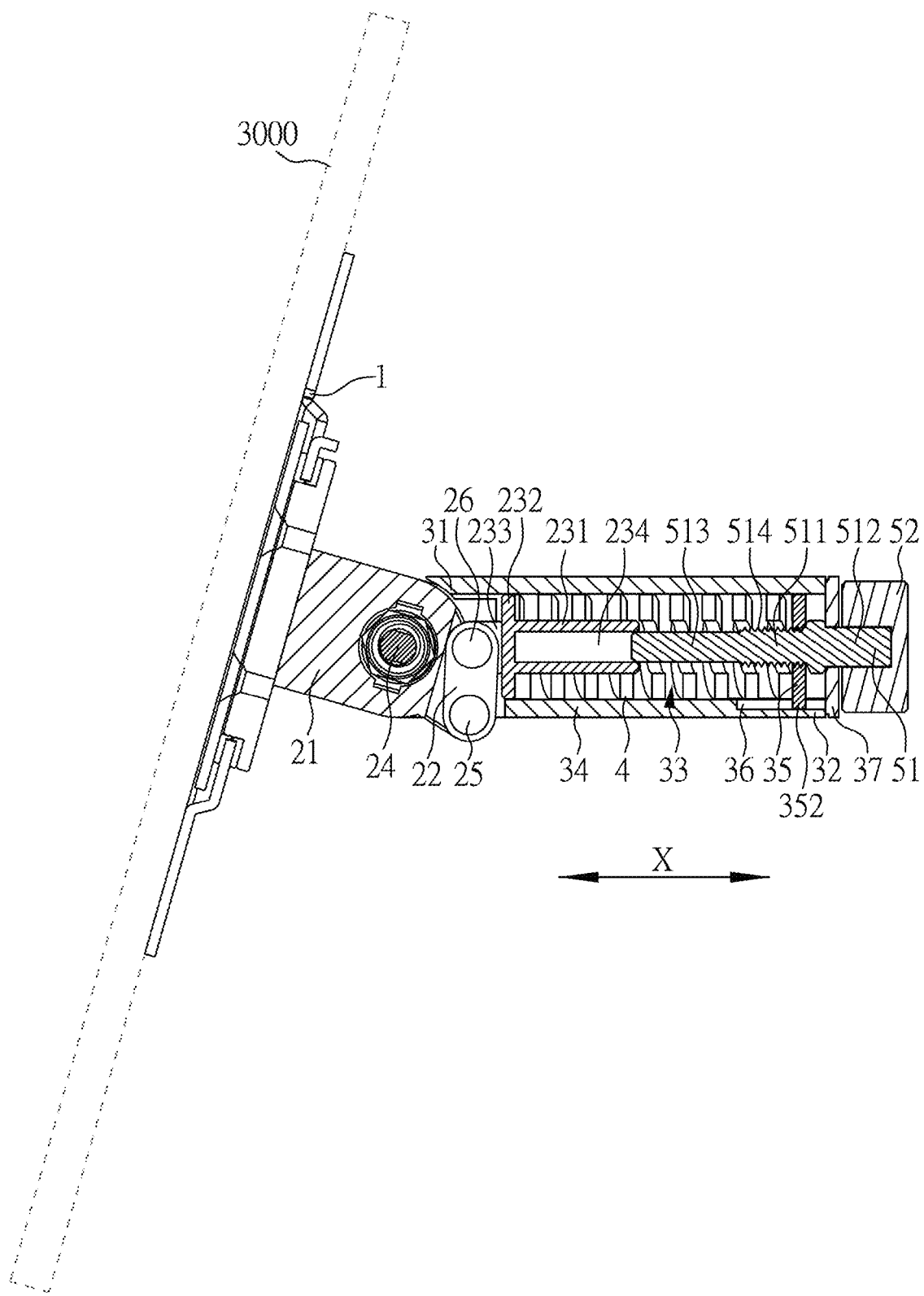
FIG. 4 is a side cross-sectional view showing the bearing plate of the hinge of an embodiment of the present invention in a first position.
Figure 5:
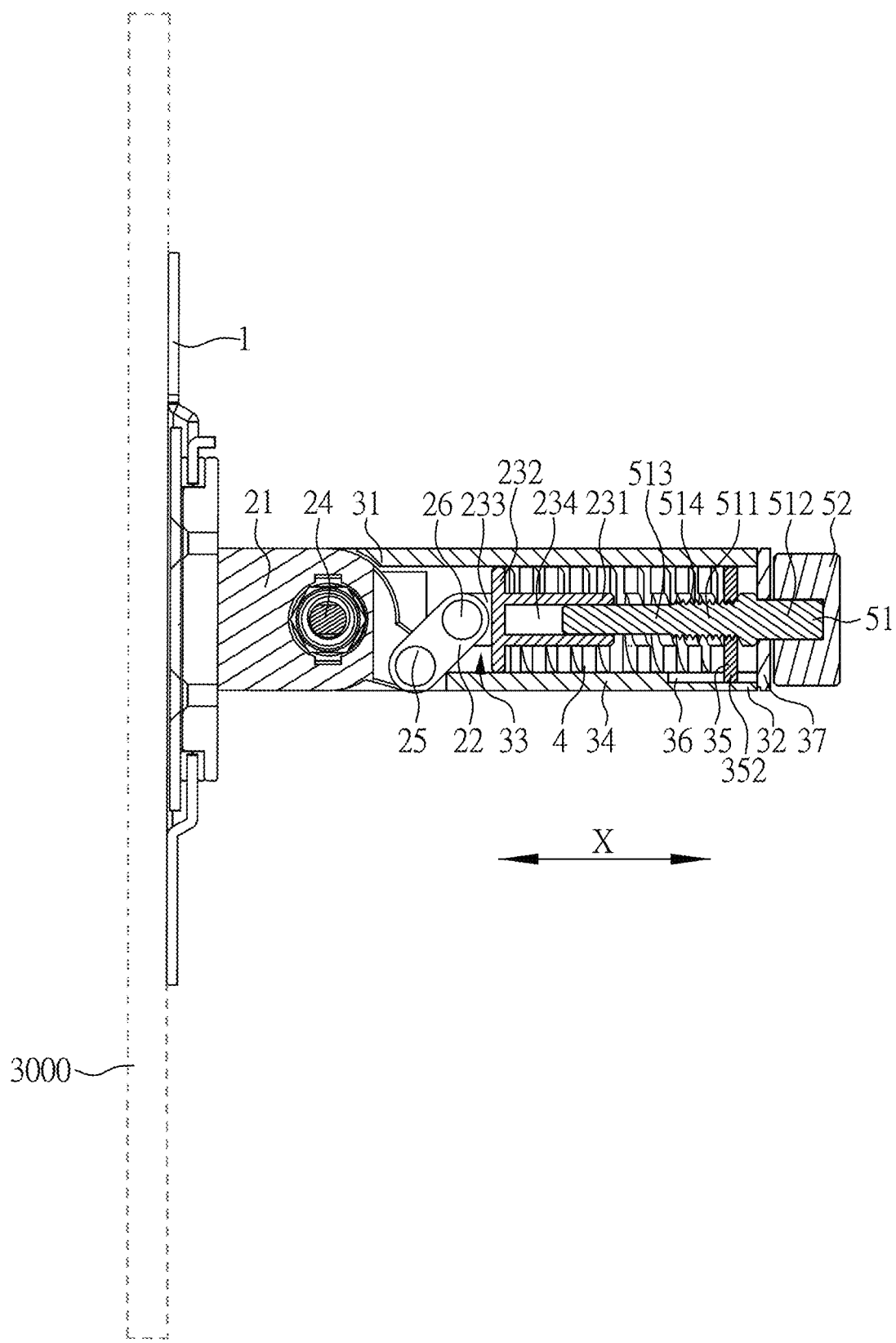
FIG. 5 is a side cross-sectional view showing the bearing plate of the hinge of an embodiment of the present invention in a second position.

Please further refer to FIG. 4 and FIG. 5. The bearing plate 1 is adapted for the display device 3000 to be disposed thereon and is linked to the linkage mechanism 2. The bearing plate 1 and the display device 3000 are able to tilt between a first position as shown in FIG. 4 and a second position as shown in FIG. 5 relative to the support 2000. The pivoting of the present embodiment is defined as adjusting a tilt angle formed between the display device 3000 and a desktop (not shown in the figures), for example.

The linkage mechanism 2 is then described in detail. The bearing plate 1 and the linkage mechanism 2 are linked to each other. The linkage mechanism 2 includes a first link 21, a second link 22, and a sliding piece 23. The first link 21 is pivotally connected on a first shaft 24 and is connected to the bearing plate 1. Another end of the first link 21 and the second link 22 are pivotally connected to each other on a second shaft 25. The second link 22 and the sliding piece 23 are pivotally connected to each other on a third shaft 26. The first link 21, the second link 22, and the sliding piece 23 are linked to each other. The sliding piece 23 linearly slides along a main axis X and always abuts against the elastic element 4.

Figure 6:
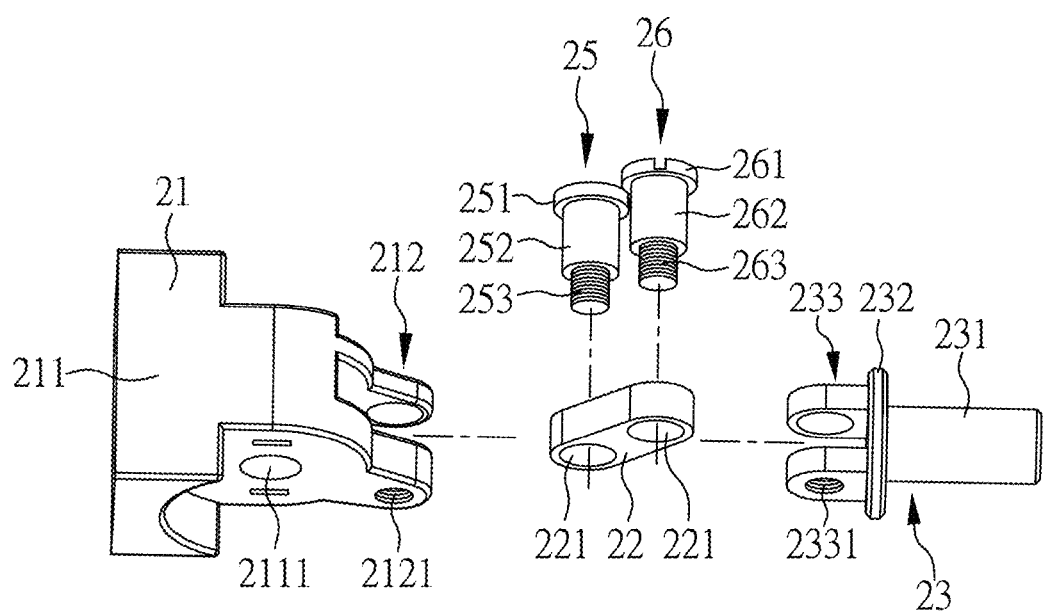
FIG. 6 is a partial exploded perspective view of the hinge of an embodiment of the present invention.
Figure 7:
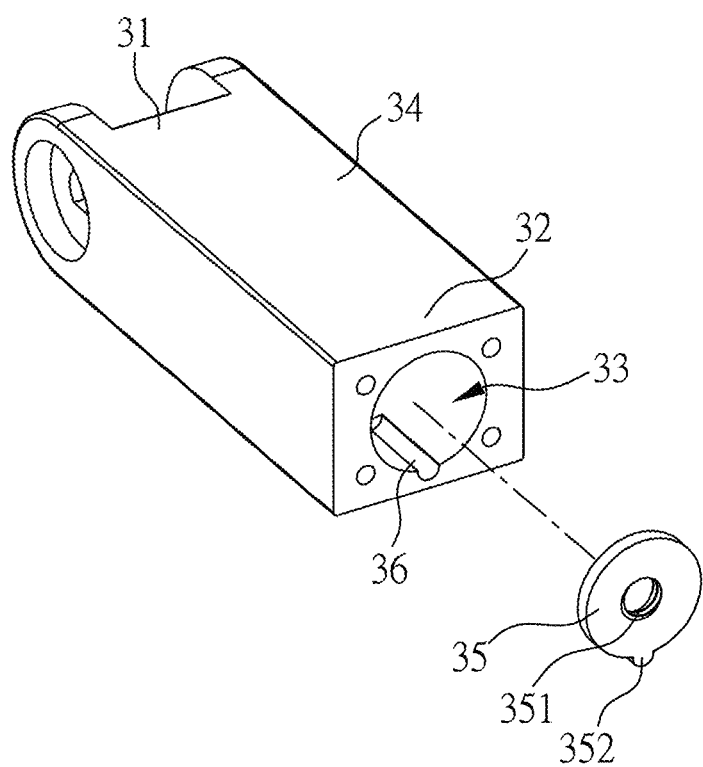
FIG. 7 is another partial exploded perspective view of the hinge of an embodiment of the present invention.

Please refer to FIG. 4 and FIG. 6, the first link 21 has a main body 211 and a first connecting section 212. The main body 211 is adapted to connect to the first bearing plate 1 and has a first shaft hole 2111. The first connecting section 212 has a second shaft hole 2121. The second link 22 has two pivot holes 221. The sliding piece 23 has a central rod 231, a thrust plate 232, a second connecting section 233, and a blind hole 234. The thrust plate 232 is fixedly sleeved to the central rod 231. The second connecting section 233 is connected to one end of the central rod 231 and has a third shaft hole 2331 to pivotally connect to the second link 22. The blind hole 234 is formed on the other end of the central rod 231 away from the second connecting section 233.

The first shaft 24 is fixed on the shell element 3 and passes through the first shaft hole 2111 of the main body 211. When the first link 21 rotates along with the bearing plate 1, the first shaft 24 does not rotate nor move relative to the shell element 3. The second shaft 25 and the third shaft 26 are not disposed on the shell element 3 so that they are able to move relative to the shell element 3. Preferably, each of the second shaft 25 and the third shaft 26 is a step screw and has a head portion 251, 261, a large diameter section 252, 262, and a small diameter section 253, 263. The head portion 251, the large diameter section 252, and the small diameter section 253 are integrally formed. The head portion 261, the large diameter section 262, and the small diameter section 263 are integrally formed. The second link 22 is sleeved on the large diameter sections 252, 262. The large diameter sections 252, 262 pass through the pivot holes 221 so that the second link 22 is able to tilt relative to the first link 21 and the slide piece 23 respectively. Both of the small diameter section 253 and the small diameter section 263 are outer threaded, which respectively match the second shaft hole 2121 and the third shaft hole 2331 which are inner threaded. The small diameter section 253 and the small diameter section 263 respectively screw to the second shaft hole 2121 and the third shaft hole 2331. Therefore, the first link 21 is stably pivotally connected to the second link 22, and the second link 22 is stably pivotally connected to the sliding piece 23.

Please refer to FIG. 1, FIG. 3, FIG. 4, and FIG. 7. The shell element 3 is disposed on the support 2000 and extends along the main axis X. The shell element 3 includes a first end 31, connected to the linkage mechanism 2, a second end 32, being relative to the first end 31, a receiving space 33, a shell body 34, a blocking plate 35, a slot 36, and a cover plate 37. The receiving space 33 is formed in the shell body 34. The outer contour of the thrust plate 232 at least partially matches the inner contour of the shell body 34 so that the sliding piece 23 moves along the main axis X in the receiving space 33. The blocking plate 35 is disposed in the receiving space 33 for the elastic element 4 to abut. The blocking plate 35 has a tapped hole 351 and a protruding portion 352. The protruding portion 352 is slidably received in the slot 36. The slot 36 is formed on an inner surface of the shell body 34 and extends along the main axis X from the second end 32. The cross-sectional area of the slot 36 is slightly larger than the cross-sectional area of the protruding portion 352, thus, the slot 36 just receives the protruding portion 352. To dispose the blocking plate 35 from the second end 32 during the assembly, one end of the shell body 34 that is close to the second end 32 is not sealed. In more detail, the slot 36 does not pass the whole shell body 34 along the main axis X, which means that the slot 36 does not extend from the second end 32 to the first end 31. The blocking plate 35, which has the protruding portion 352, cannot be disposed into the receiving space 33 from the first end 31 during the assembly, therefore, the blocking plate 35 is disposed from the second end 32 instead. The cover plate 37 is detachably screwed on the second end 32.

The elastic element 4 is disposed in the receiving space 33 and abuts against between the linkage mechanism 2 and the shell element 3 to provide an elastic force. In more detail, the elastic element 4 pushes the thrust plate 232 of the sliding piece 23 and the blocking plate 35 of the shell element 3. In the present embodiment, the elastic element 4 is a compression spring. In other embodiments, the elastic element 4 can be any other element that has a similar function.

Figure 8:
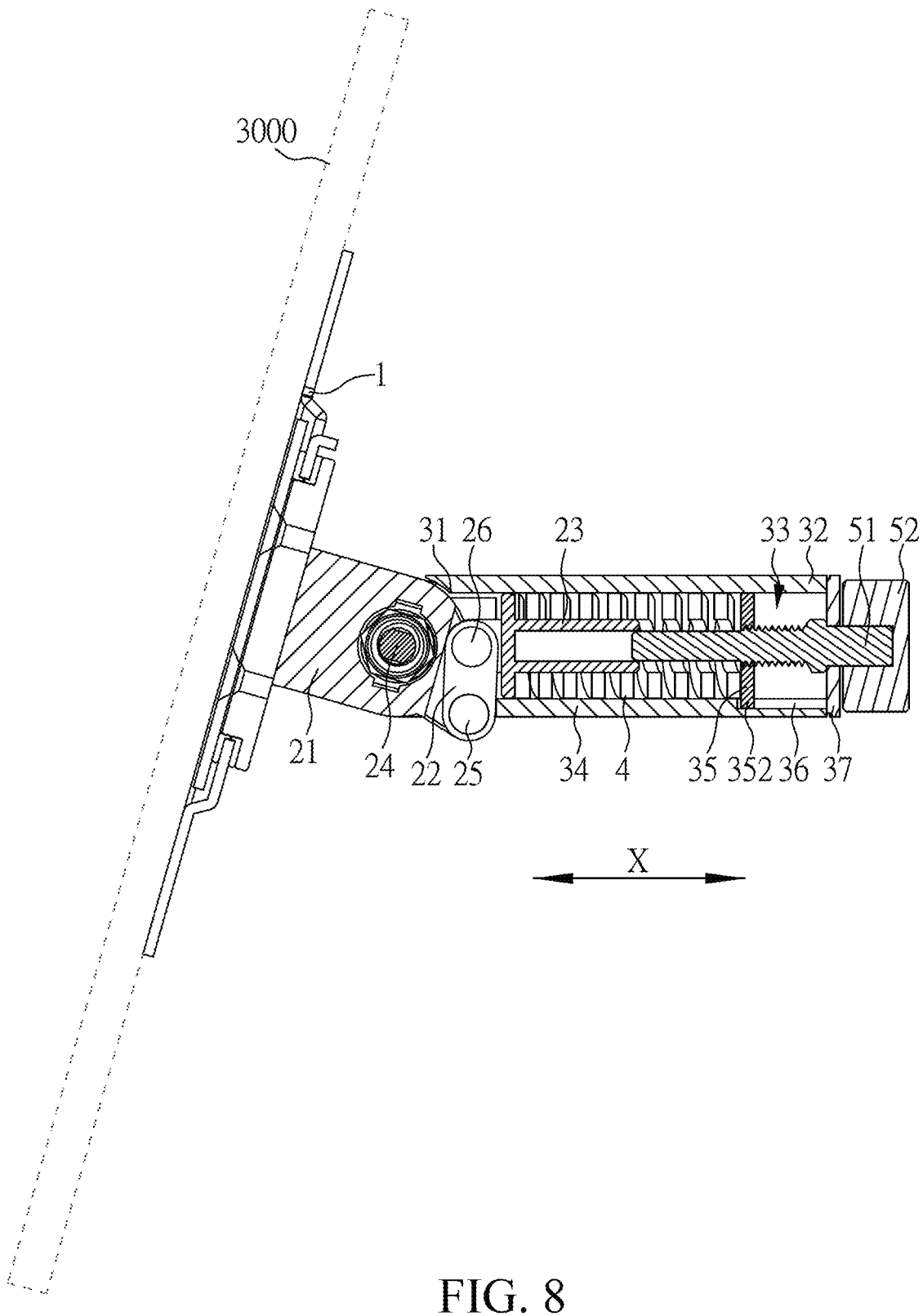
FIG. 8 is a side cross-sectional view of the hinge of an embodiment of the present invention when the position of the blocking plate is adjusted.

Please refer to FIG. 4 and FIG. 8, the adjustment module 5 is adapted to adjust a preliminary pre-compressed amount of the elastic element 4. More specifically, when the adjustment module 5 is adjusted, a position of the blocking plate 35 along the main axis X in the receiving space 33 is changed. By moving the position of the blocking plate 35, the distance between the thrust plate 232 and the blocking plate 35 along the main axis X can be changed. The preliminary pre-compressed amount of the elastic element 4 is thereby changed, and a range of the elastic force provided by the elastic element 4 can be adjusted correspondingly to the weight of each different display device 3000.

Figure 9:
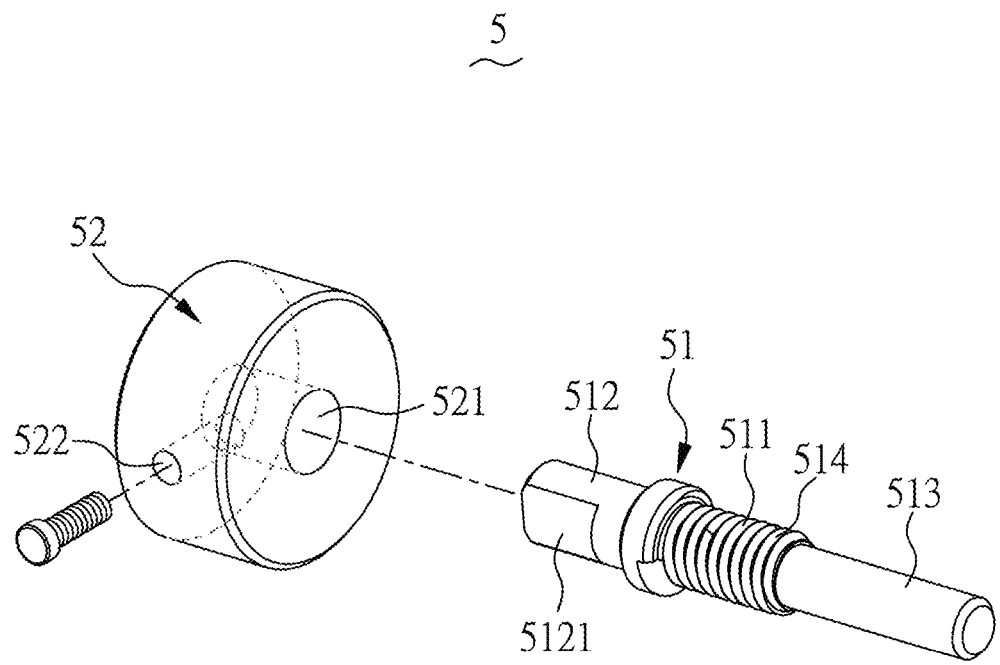
FIG. 9 is another partial exploded perspective view of the hinge of an embodiment of the present invention.

Please refer to FIG. 9 as well. The adjustment module 5 includes a screw rod 51 and a knob 52. The screw rod 51 pivotally connects and passes through the shell element 3 and is idle in the original position. The screw rod 51 has a rod body 511, a front portion 512, an end portion 513 relative to the front portion 512, and a thread 514. The thread 514 is formed on the rod body 511. The front portion 512 is partially exposed outside of the shell element 3. The rod body 511 and the end portion 513 is located in the receiving space 33. The end portion 513 is partially disposed in the blind hole 234. In other words, the sliding piece 23 is slidably sleeved around the end portion 513 of the screw rod 51 through the blind hole 234. The screw rod 51 is screwed with the blocking plate 35. More specifically, the rod body 511 of the screw rod 51 is screwed in the tapped hole 351. When the screw rod 51 rotates about the main axis X, the protruding portion 352 of the blocking plate 35 is limited by the slot 36. The blocking plate 35 moves forward or backward along the main axis X in the receiving space 33, i.e. moves toward or away from the bearing plate 1. Moreover, when the cover plate 37 is screwed on the shell body 34, the blocking plate 35 and a part of the screw rod 51 are limited in the receiving space 33 without leaving the shell element 3 from the second end 32 while operating. The knob 52 is fixedly sleeved on the front portion 512 and synchronously rotates with the screw rod 51.

It should be noted that the front portion 512 of the screw rod 51 further has a leaning plane 5121. The knob 52 further has an insertion hole 521 and a securing hole 522. The insertion hole 521 extends along the main axis X, and the securing hole 522 extends along an axis perpendicular to the main axis X. The insertion hole 521 and the securing hole 522 are connected. In more detail, the front portion 512 of the screw rod 51 is inserted in the insertion hole 521. The leaning plane 5121 is corresponding to the securing hole 522. A screw is screwed in the securing hole 522 to lean against the leaning plane 5121. In other embodiments, the front portion 512 of the screw rod 51 has an ellipse-shaped cross-section, and the insertion hole 521 of the knob 52 is an ellipse-shaped hole, which tightly matches the front portion 512. The securing hole 522 and the screw can be omitted under the circumstance. In other embodiments, the knob 52 can be omitted, and the preliminary pre-compressed amount of the elastic element 4 can be adjusted merely with the front portion 512 of the screw rod 51.

The operation of the hinge 1000 of the present invention is detailed described as follows.

When an external force is applied, the display device 3000 and the bearing plate 1 rotate about the first shaft 24 relative to the support 2000 between the first position and the second position. The bearing plate 1 is linked to the linkage mechanism 2 to compress or loosen the elastic element 4 and make the elastic force changed. When the external force is removed, the display device 3000 and the bearing plate 1 can be stopped at once at any position between the first position and the second position.

As illustrated in FIG. 4 and FIG. 5, when the bearing plate 1 rotates from the first position to the second position, the first link 21 rotates along with the bearing plate 1 and drives the second link 22 and the sliding piece 23. The second link 22 pushes the sliding piece 23 to slide towards the second end 32 along the main axis X. The compression degree of the elastic element 4 increases and the elastic force increases. When the bearing plate 1 rotates from the second position to the first position, the first link 21 pulls back the second link 22 towards the first end 31. The second link 22 drives the sliding piece 23 to slide away from the second end 32 along the main axis X. The compression degree of the elastic element decreases and the elastic force decreases.

The elastic force generates a compensation torque to resist the gravity torque generated by the weight of the bearing plate 1 and the display device 3000. When the bearing plate 1 tilts at different angles, the elastic element 4 provides different elastic forces. The compensation torque is affected by the elastic force and the change of the relative position of the elements of the linkage mechanism 2 and changes along with different tilt angles of the bearing plate 1. Backed by the friction generated among the elements of the linkage mechanism 2, the bearing plate 1 and the display device 3000 can be stopped at once at any position relative to the support 2000.

Moreover, when the bearing plate 1 is located at the first position, a distance between the first shaft 24 and the third shaft 26 is the shortest and the elastic element 4 is least compressed. Under this circumstance, there are a minimum elastic force and a minimum compensation torque generated by the elastic force. The gravity torque to be resisted is minimum as well. When the bearing plate 1 is located at the second position, the distance between the first shaft 24 and the third shaft 26 is the longest and the elastic element 4 is most compressed. Under this circumstance, there are a maximum elastic force and a maximum compensation torque generated by the elastic force. The gravity torque to be resisted is maximum as well. In other words, the gravity torque and the compensation torque increases from the first position to the second position.

According to FIG. 4 and FIG. 8, by the means of adjusting the adjustment module 5 to move the blocking plate 35, the elastic element 4 may provide different preliminary pre-compressed amounts and different compensation torques. When the blocking plate 35 is close to the first end 31, the preliminary pre-compressed amount of the elastic element 4 is large and the corresponding compensation torque is large. Therefore, the display device 3000 with a heavy weight can be supported. When the blocking plate 35 is close to the second end 32, the preliminary pre-compressed amount of the elastic element 4 is small and the corresponding compensation torque is small. Therefore, merely the display device 3000 with a light weight can be supported. The user may adjust the preliminary pre-compressed amount of the elastic element 4 according to the weight of the display device 3000 so that the bearing plate 1, which supports the display device 3000 of any scale, can be stopped at once at any position between the first position and the second position.

In summary, the compression spring being adapted by the hinge of the present invention has the advantages of providing a large supporting force and a wide supporting range. Due to the disposition of the linkage mechanism, the compensation torque is generated and is cooperated with the gravity torque and the friction generated among the elements of the linkage mechanism, therefore, the bearing plate and the display device can rotate and stop at once at any position. The adjustment module can adjust the preliminary pre-compressed amount of the elastic element to change the numerical interval of the compensation torque generated by the elastic element. Therefore, the hinge of the present invention is suitable to support different display devices with different weights.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A hinge, being disposed on a stand and adapted for supporting a display device, the hinge comprising:
   a bearing plate being adapted for the display device to be disposed thereon and tilting between a first position and a second position relative to the stand;
   a linkage mechanism being linked to the bearing plate, wherein the linkage mechanism includes a first link, a second link, and a sliding piece, the first link is pivotally connected on a first shaft and is connected to the bearing plate, the first link and the second link are pivotally connected to each other on a second shaft, the second link and the sliding piece are pivotally connected to each other on a third shaft, the first link, the second link, and the sliding piece are linked to each other, and the sliding piece linearly slides along the main axis and abuts against the elastic element;
   a shell element being disposed on the stand and extending along a main axis, the shell element including a first end, connected to the linkage mechanism, a second end, being relative to the first end, and a receiving space; and
   an elastic element being disposed in the receiving space and abutting against the linkage mechanism and the shell element to provide an elastic force;
   wherein, when an external force is applied, the display device and the bearing plate rotate relative to the stand between the first position and the second position, the bearing plate is linked to the linkage mechanism to compress or loosen the elastic element to change the elastic force, and when the external force is removed, the display device and the bearing plate can be stopped at once at any position between the first position and the second position.

2. The hinge as claimed in claim 1, wherein when the bearing plate rotates from the first position to the second position, the first link rotates along with the bearing plate and drives the second link and the sliding piece, so that the sliding piece slides towards the second end along the main axis to compress the elastic element and the elastic force increases, when the bearing plate rotates from the second position to the first position, the sliding piece slides away from the second end along the main axis to loosen the elastic element and the elastic force decreases.

3. The hinge as claimed in claim 2, wherein the first shaft is fixed on the shell element, when the first link rotates along with the bearing plate, the second shaft and the third shaft move relative to the shell element.

4. The hinge as claimed in claim 3, wherein when the bearing plate is located at the first position, a distance between the first shaft and the third shaft is the shortest and the elastic element is least compressed, and when the bearing plate is located at the second position, the distance between the first shaft and the third shaft is the longest and the elastic element is most compressed.

5. The hinge as claimed in claim 4, wherein each of the second shaft and the third shaft is a step screw, having a head portion, a large diameter section, and a small diameter section, the head portion, the large diameter section, and the small diameter section are integrally formed, the second link is sleeved to the large diameter sections, and the second link has two pivot holes for the large diameter sections to pass through.

6. The hinge as claimed in claim 5, wherein the sliding piece has a central rod and a thrust plate, the thrust plate is sleeved to the central rod, and the elastic element pushes the thrust plate.

7. The hinge as claimed in claim 6, wherein the elastic element is a compression spring.

8. The hinge as claimed in claim 1, wherein the shell element further includes a shell body and a blocking plate, the receiving space is formed in the shell body, the blocking plate is disposed in the receiving space, and the elastic element abuts the blocking plate.

9. The hinge as claimed in claim 8, further comprising an adjustment module, wherein the blocking plate is movably disposed along the main axis in the receiving space, when the adjustment module is adjusted, a position of the blocking plate along the main axis in the receiving space is changed to adjust a preliminary pre-compressed amount of the elastic element.

10. The hinge as claimed in claim 9, wherein the adjustment module includes a screw rod, the screw rod pivotally connects and passes through the shell element and has a thread, the blocking plate has a tapped hole, the screw rod is screwed with the blocking plate, when the screw rod rotates about the main axis, the blocking plate moves toward or away from the bearing plate along the main axis in the receiving space.

11. The hinge as claimed in claim 10, wherein the screw rod has a rod body, the thread is formed on the rod body to be screwed with the blocking plate.

12. The hinge as claimed in claim 11, wherein the sliding piece of the linkage mechanism has a blind hole, the screw rod has an end portion, the end portion is located in the receiving space, and the sliding piece is slidably sleeved around the end portion of the screw rod through the blind hole.

13. The hinge as claimed in claim 12, wherein the adjustment module further includes a knob, the screw rod further has a front portion relative to the end portion, the front portion is partially exposed outside of the shell element, and the knob is fixedly sleeved around the front portion and synchronously rotates with the screw rod.

14. The hinge as claimed in claim 10, wherein the shell element further includes a slot extending along the main axis, the slot is formed on an inner surface of the shell body, the blocking plate further includes a protruding portion, and the protruding portion is slidably received in the slot.

* * * * *